(12) United States Patent
Kim

(10) Patent No.: US 9,052,352 B2
(45) Date of Patent: Jun. 9, 2015

(54) FUSE CIRCUIT AND TESTING METHOD OF THE SAME

(75) Inventor: Kwi-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 520 days.

(21) Appl. No.: 13/595,259

(22) Filed: Aug. 27, 2012

(65) Prior Publication Data

US 2013/0162263 A1     Jun. 27, 2013

(30) Foreign Application Priority Data

Dec. 21, 2011     (KR) .................. 10-2011-0139635

(51) Int. Cl.
  *G11C 17/18*     (2006.01)
  *G01R 31/07*     (2006.01)
(52) U.S. Cl.
  CPC .............. *G01R 31/07* (2013.01); *G11C 17/18* (2013.01)

(58) Field of Classification Search
  USPC ............... 365/225.7, 201, 210.1, 189.07
  See application file for complete search history.

(56) References Cited

U.S. PATENT DOCUMENTS

| | | | |
|---|---|---|---|
| 5,453,959 A * | 9/1995 | Sakuta et al. | 365/189.09 |
| 7,697,355 B2 * | 4/2010 | Kobayashi | 365/201 |
| 2002/0097623 A1 * | 7/2002 | Suzuki et al. | 365/210 |
| 2004/0151048 A1 * | 8/2004 | Cho | 365/225.7 |
| 2009/0027982 A1 * | 1/2009 | Kobayashi | 365/201 |
| 2012/0069638 A1 * | 3/2012 | Matsuda et al. | 365/158 |

* cited by examiner

*Primary Examiner* — Tuan T Nguyen
(74) *Attorney, Agent, or Firm* — IP & T Group LLP

(57) ABSTRACT

A fuse circuit includes a data line, a plurality of fuse cells selectively programmed and electrically connected with the data line in response to respective selection signals, a dummy fuse cell electrically connected with the data line in response to a test signal, and a sense amplifier configured to sense a data of the data line. The fuse circuit includes a plurality of fuses, reduces the area thereof, and easily detects whether a sense amplifier operates properly or not in the fuse circuit.

15 Claims, 6 Drawing Sheets

FUSE CIRCUIT AND TESTING METHOD OF THE SAME

CROSS-REFERENCE TO RELATED APPLICATIONS

The present application claims priority of Korean Patent Application No. 10-2011-0139635, filed on Dec. 21, 2011, which is incorporated herein by reference in its entirety.

BACKGROUND

1. Field

Exemplary embodiments of the present invention relate to a fuse circuit used for storing diverse data in a variety of semiconductor devices.

2. Description of the Related Art

Generally, a data of a fuse is recognized based on whether the fuse is cut or not. The fuse may be cut by using a laser. While programming a fuse of a semiconductor device in the wafer stage thereof, however, it is difficult to program the fuse by using a laser after the wafer is mounted in a package.

Therefore, an anti-fuse, which is also known as an e-fuse, is used. The anti-fuse, or e-fuse, stores data by using a transistor and changing the resistance between a gate and a drain/source of the transistor.

FIG. 1 is a schematic diagram illustrating an anti-fuse which is formed of a transistor and operates as a resistor or a capacitor.

Referring to FIG. 1, the anti-fuse is formed of a transistor T, and a power supply voltage is applied to a gate G of the transistor T while a ground voltage is applied to the drain/source D/S thereof.

When a power source voltage a level of which the transistor T may endure is applied to the gate G, the anti-fuse operates as a capacitor C. Therefore, no current flows between the gate G and the drain/source D/S. However, when a high level of power source voltage that the transistor T may not endure is applied to the gate G, the gate oxide of the transistor T is destroyed to short-circuit the gate G and the drain/source D/S from each other and as a result the anti-fuse operates as a resistor R. Therefore, current flows between the gate G and the drain/source D/S.

According to this phenomenon, the anti-fuse recognizes a data based on the resistance value between the gate G and the drain/source D/S of the anti-fuse. To recognize the data of the anti-fuse, 1) the anti-fuse directly recognizes the data without performing an amplification operation by enlarging the size of the transistor T, or 2) the anti-fuse recognizes the data by including an amplifier instead of enlarging the size of the transistor T and sensing/amplifying the current flowing through the transistor T. Since the two methods require a large transistor T or an amplifier for amplifying data, there is limitation in terms of area.

SUMMARY

An embodiment of the present invention is directed to reducing the area of a fuse circuit including a plurality of fuses and easy detecting whether a sense amplifier operates properly or not in the fuse circuit.

In accordance with an exemplary embodiment of the present invention, a fuse circuit includes, a data line, a plurality of fuse cells selectively programmed and electrically connected with the data line in response to respective selection signals, a dummy fuse cell electrically connected with the data line in response to a test signal, and a sense amplifier configured to sense a data of the data line.

In accordance with another exemplary embodiment of the present invention, a semiconductor device includes a data line, a plurality of fuse cells selectively programmed with a data and configured to transfer the programmed data to the data line in response to respective selection signals, a dummy fuse cell configured to include a resistor that is electrically connected with the data line in response to a test signal, a sense amplifier configured to sense the data transferred to the data line, and a plurality of registers configured to store the data sensed by the sense amplifier.

In accordance with yet another exemplary embodiment of the present invention, a method for testing a fuse circuit includes enabling a test signal, coupling a resistor with a data line of the fuse circuit in response to the test signal to supply a pull-up voltage to the data line through the resistor, and comparing a voltage of the data line with a reference voltage to output a data.

DETAILED DESCRIPTION

Figure 1:
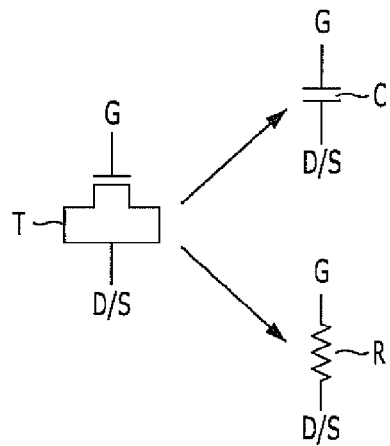
FIG. 1 is a schematic diagram illustrating an anti-fuse which is formed of a transistor and operates as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
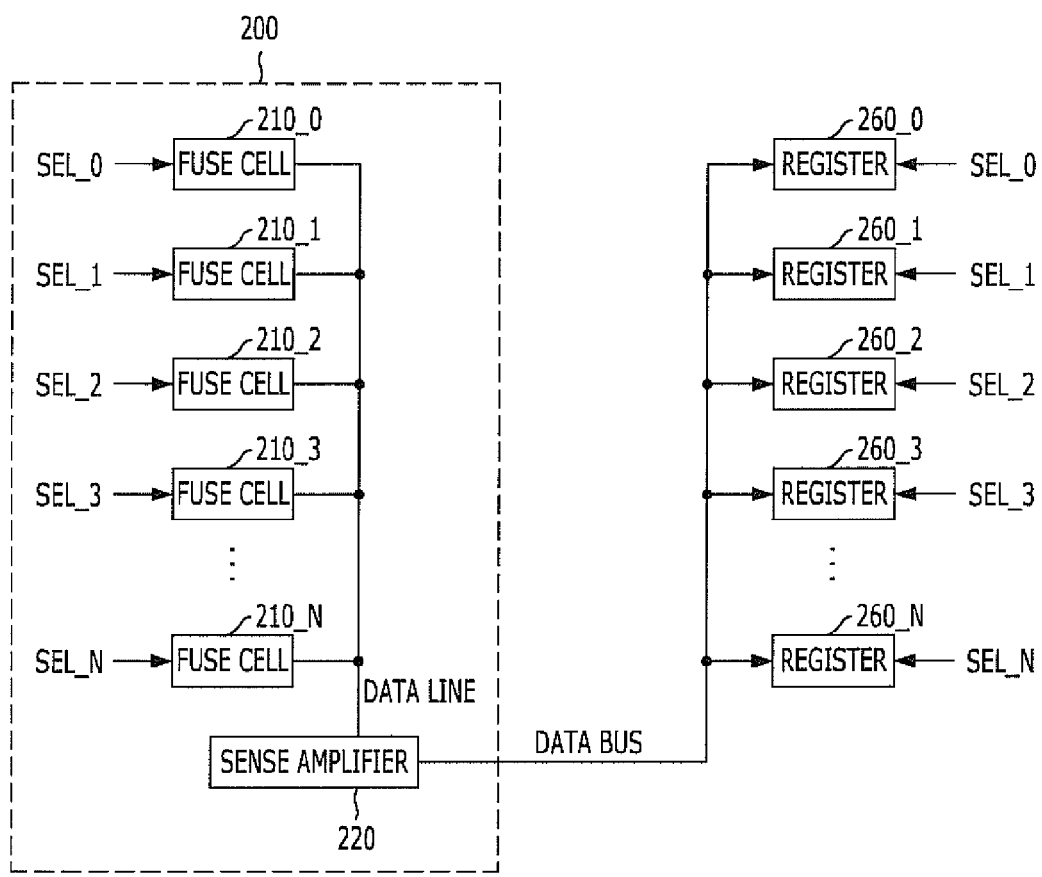
FIG. 2 is a block diagram illustrating a semiconductor device in accordance with an exemplary embodiment of the present invention.

FIG. 2 is a block diagram illustrating a semiconductor device in accordance with an exemplary embodiment of the present invention.

Referring to FIG. 2, the semiconductor device includes a fuse circuit 200 and a plurality of registers 260_0 to 260_N. The fuse circuit 200 includes a plurality of fuse cells 210_0 to 210_N and a sense amplifier 220.

Each of the fuse cells 210_0 to 210_N stores a data after a program operation. The fuse cells 210_0 to 210_N may be anti-fuse cells that perform an amplification operation to sense data. However, since an ordinary fuse that may be cut by a laser, not the anti-fuse, may need amplification, the fuse cells 210_0 to 210_N may be fuses of another kind that are not anti-fuses. The fuse cells 210_0 to 210_N are selected by selection signals SEL_0 to SEL_N, respectively, and a selected fuse cell outputs the data stored therein to a data line. The selection signals SEL_0 to SEL_N are not enabled at the same time and one selection signal is enabled at one time.

The sense amplifier 220 amplifies the data of the selected fuse cell that is transferred to the data line and outputs the amplified data to a data bus.

The registers 260_0 to 260_N store the data that is amplified by the sense amplifier 220 and transferred to the data bus. The registers 260_0 to 260_N are enabled in response to the selection signals SEL_0 to SEL_N corresponding thereto. Each of the registers 260_0 to 260_N stores a data of a corresponding fuse cell among the fuse cells 210_0 to 210_N. For example, a data of a first fuse cell 210_0 is amplified by the sense amplifier 220 and stored in a first register 260_0, and a data of a fourth fuse cell 210_4 is amplified by the sense amplifier 220 and stored in a fourth register 260_4. The registers 260_0 to 260_N may include a simple latch. Since the registers 260_0 to 260_N have characteristics of inputting/outputting data quickly, the semiconductor device including the fuse circuit 200 may rapidly access the data stored in a register and obtain a data required by the semiconductor device. The registers 260_0 to 260_N are disposed in the parts that require the data stored in the fuse cells 210_0 to 210_N in the semiconductor device.

The fuse circuit 200 sequentially amplifies the data stored in the fuse cells 210_0 to 210_N and transfers the amplified data to the registers 260_0 to 260_N to be stored therein. The data stored in the registers 260_0 to 260_N are provided as the data that are required by the semiconductor device including the fuse circuit 200. Since an amplification operation is sequentially performed in the sense amplifier 220, the fuse cells 210_0 to 210_N does not use a plurality sense amplifiers and this leads to remarkably decreased area of the fuse circuit.

The data stored in the fuse cells 210_0 to 210_N are to be amplified and stored in the registers 260_0 to 260_N in order for the semiconductor device including the fuse circuit 200 to use the data stored in the fuse cells 210_0 to 210_N. Therefore, the operation that the sense amplifier 220 amplifies the stored data and the operation that the amplified data are stored in the registers 260_0 to 260_N may be performed in the initial operation of the semiconductor device.

Figure 3A:
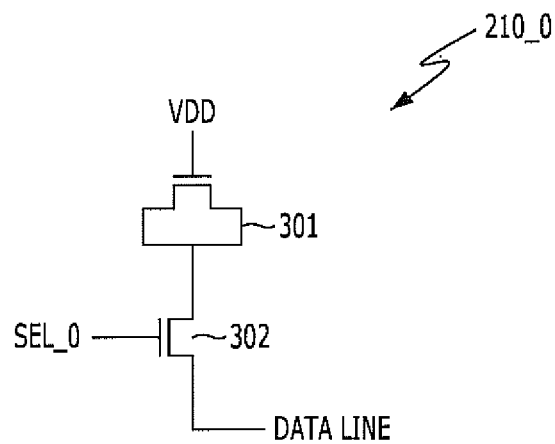
FIGS. 3A, 3B and 3C are schematic diagrams illustrating a fuse cell 210_0 of FIG. 2.
Figure 3B:
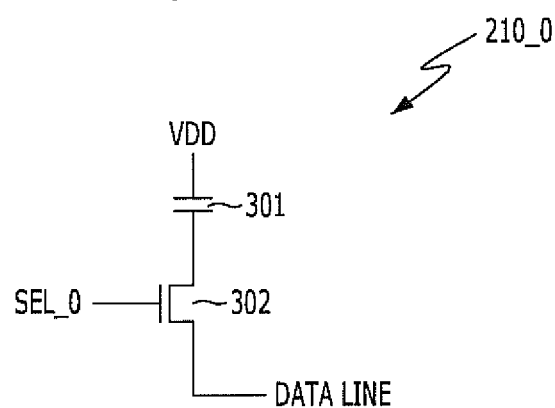
Figure 3C:
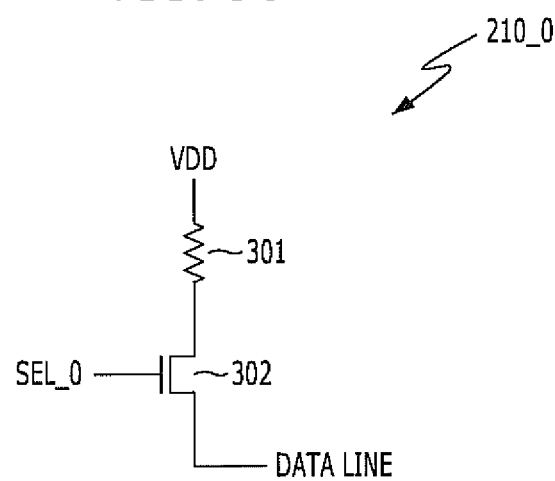

FIGS. 3A, 3B and 3C are schematic diagrams illustrating a fuse cell 210_0 of FIG. 2.

Referring to FIGS. 3A, 3B and 3C, the fuse cell 210_0 includes a fuse 301 and a transistor 302. The fuse 301 operates as a capacitor or a resistor depending on whether the fuse 301 is programmed, or ruptured, or not. The transistor 302 selectively couples the fuse 301 with the data line in response to a selection signal SEL_0.

Referring to FIG. 3A, a power source voltage VDD is applied to a gate of a transistor that constitutes the fuse 301. The drawing illustrates a voltage applied when the data of the fuse 301 is read. When the fuse 301 is programmed, a high voltage which is so high as to destroy the gate oxide is applied to the gate of the transistor.

FIG. 3B shows a case that the fuse cell 210_0 is not programmed. FIG. 3C shows a case that the fuse cell 210_0 is programmed. Referring to FIG. 3B, when the fuse cell 210_0 is not programmed, it operates as a capacitor. Therefore, even when the selection signal SEL_0 is enabled, a current path is not formed between the fuse cell 210_0 and the data line.

Figure 4:
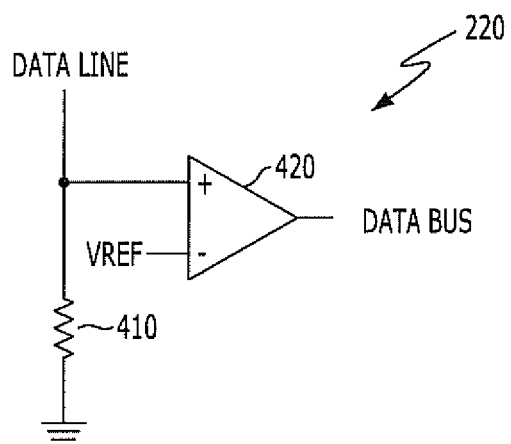
FIG. 4 is a schematic diagram illustrating a sense amplifier 220 of FIG. 2.

FIG. 4 is a schematic diagram illustrating a sense amplifier 220 of FIG. 2.

Referring to FIG. 4, the sense amplifier 220 includes a resistor 410 and a comparator 420. The resistor 410 is coupled between the data line and a source terminal, which is a ground terminal. The comparator 420 compares the voltage of the data line with a reference voltage VREF.

Hereinafter, the operations of the sense amplifier 220 when a fuse cell selected by a selection signal among the multiple fuse cells 210_0 to 210_N is programmed and when a fuse cell selected by a selection signal among the multiple fuse cells 210_0 to 210_N is not programmed are described.

When the selected fuse cell is programmed, current flows from the selected fuse cell to the data line. Therefore, voltage drop occurs in the resistor 410 and thus the voltage level of the data line is raised higher than the reference voltage VREF. Therefore, the output of the comparator 420 is of a logic high level.

When the selected fuse cell is not programmed, no current flows from the selected fuse cell to the data line. Therefore, no voltage drop occurs in the resistor 410 and the data line maintains a low voltage level. Therefore, the output of the comparator 420 is of a logic low level.

In the fuse circuit 200 of an array structure, which is described above with reference to FIGS. 2 to 4, since the data of the fuse cells 210_0 to 210_N are sensed through the sense amplifier 220, it is important to secure reliability of the sense amplifier 220 and figure out the characteristics of the sense amplifier 220.

Figure 5:
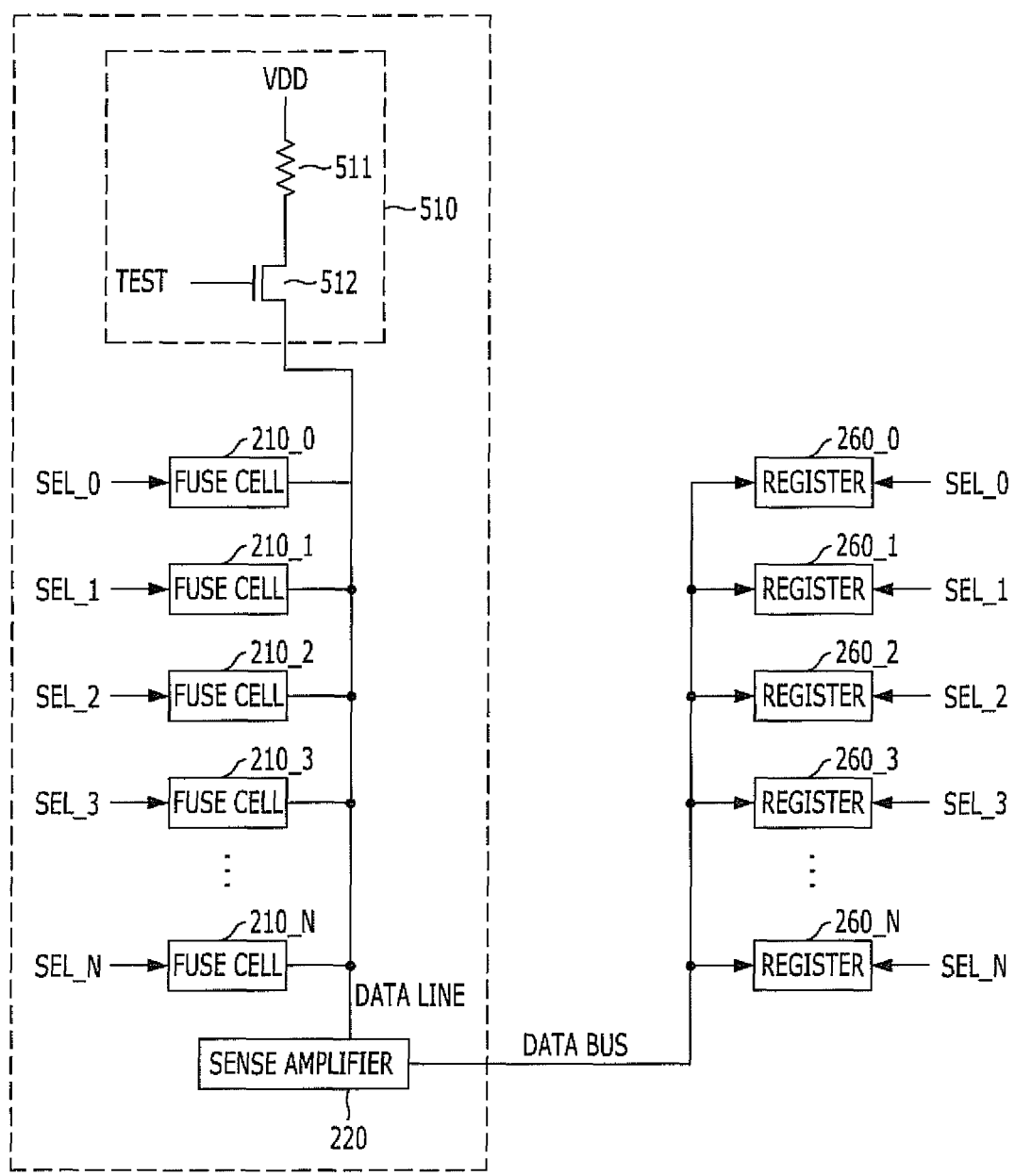
FIG. 5 is a block diagram illustrating a semiconductor device in accordance with another exemplary embodiment of the present invention.

FIG. 5 is a block diagram illustrating a semiconductor device in accordance with another exemplary embodiment of the present invention.

Referring to FIG. 5, the fuse circuit 200 of FIG. 5 further includes a dummy fuse cell 510 for verifying the operation of the sense amplifier 220.

The dummy fuse cell 510 includes a resistor 511 and a transistor 512. One end of the resistor 511 is coupled with a power supply voltage VDD terminal. The transistor 512 electrically connects the other end of the resistor 511 and the data line in response to a test signal TEST. Since the dummy fuse cell 510 is used for verifying the operation of the sense amplifier 220, the resistance value of the resistor 511 may be set to be the same as the resistance value of the programmed fuse cell.

Figure 6:
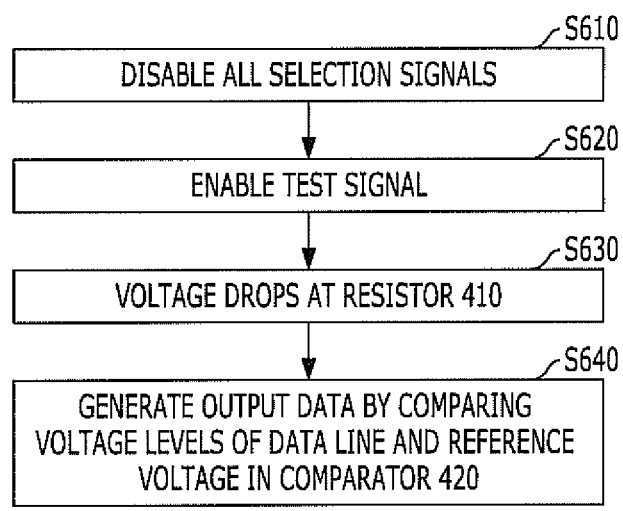
FIG. 6 is a flowchart describing a process for verifying the operation of a sense amplifier 220 shown in FIG. 5.

FIG. 6 is a flowchart describing a process for verifying the operation of a sense amplifier 220 shown in FIG. 5. Referring to FIGS. 6 and 5, a process of verifying the operation of the sense amplifier 220 is described. First, in step S610, all of the selection signals SEL_0 to SEL_N are disabled. As a result, all of the fuse cells 210_0 to 210_N and the data line are electrically disconnected. Subsequently, in step S620, the test signal TEST is enabled. When the test signal TEST is enabled, the dummy fuse cell 510 and the data line are electrically connected. In step S630, a voltage drop occurs in the resistor 410 of the sense amplifier 220, due to the current flowing from the dummy fuse cell 510 to the data line. In step S640, the voltage level of the data line is raised due to the voltage drop occurring in the resistor 410 and compared with the reference voltage VREF in the comparator 420, and a comparison result data is outputted. If the sense amplifier 220 operates properly, a logic high data is outputted through the comparator 420 of the sense amplifier 220. If the sense amplifier 220 has an operation fault, a logic low data is outputted through the comparator 420 of the sense amplifier 220. Therefore, whether the sense amplifier 220 operates properly or not may be verified based on the output data of the comparator 420 of the sense amplifier 220.

Figure 7:
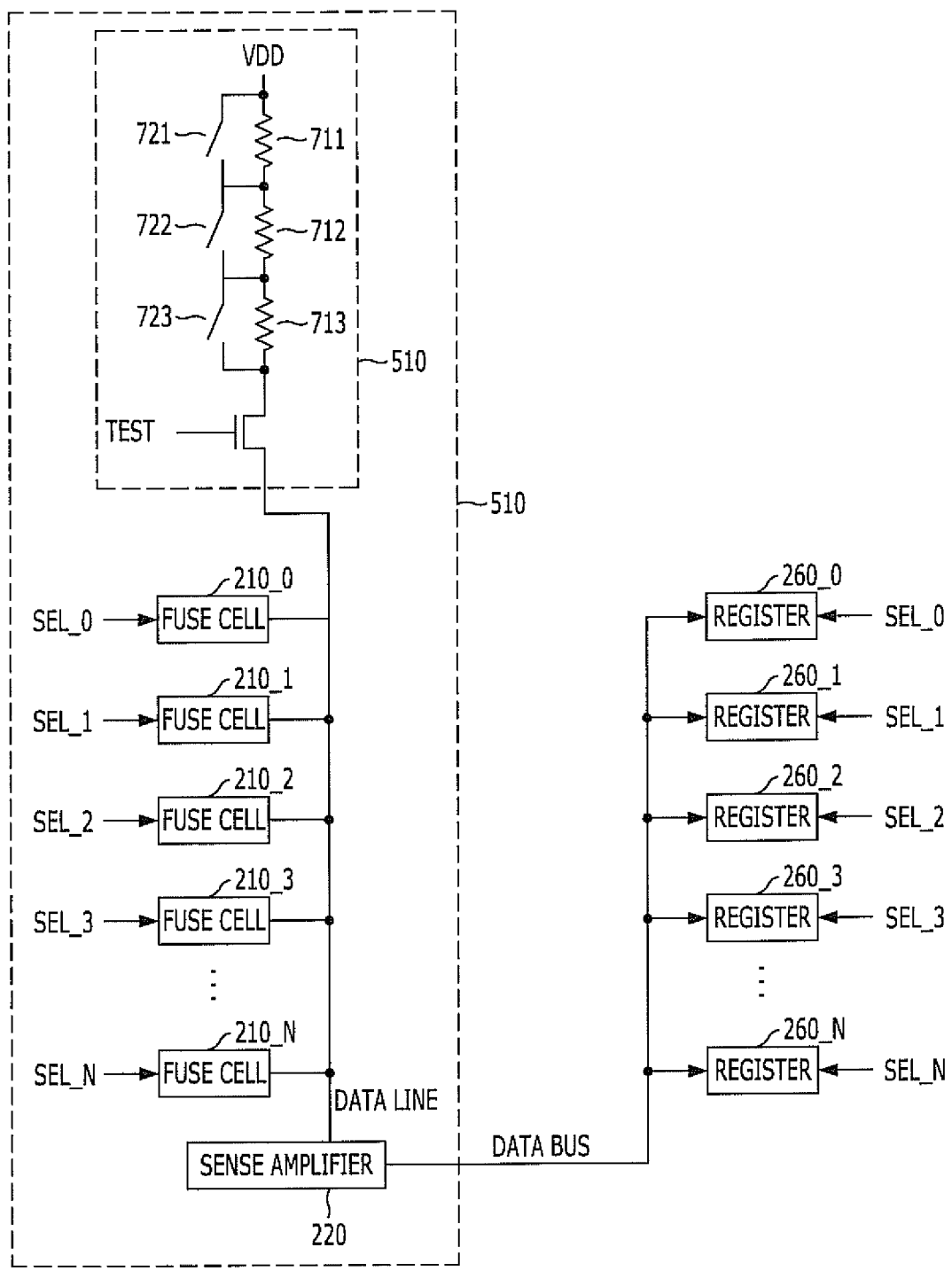
FIG. 7 is a block diagram illustrating a semiconductor device in accordance with yet another exemplary embodiment of the present invention.

FIG. 7 is a block diagram illustrating a semiconductor device in accordance with yet another exemplary embodiment of the present invention.

Referring to FIG. 7, although the embodiment of FIG. 7 includes the dummy fuse cell 510, just as the embodiment of FIG. 5. does, the resistor of the dummy fuse cell is substituted by a plurality of resistors 711, 712 and 713 and a plurality of switches 721, 722 and 723. The switches 721, 722 and 723 may be realized as diverse switching devices, such as metal option or transistor.

According to the embodiment of FIG. 7, since the internal resistance value of the dummy fuse cell 510 may be diversely controlled by controlling the switches 721, 722 and 723, the operation characteristics of the sense amplifier 220 may be verified under diverse conditions.

The verification of the operation characteristics of the sense amplifier 220 may be performed through the same process as FIG. 6. If any, the operation characteristics of the sense amplifier 220 may be figured out more accurately by repeating the process of FIG. 6 while changing the resistance value of the dummy fuse cell 510.

According to an embodiment of the present invention, the area of a fuse circuit may be reduced, and whether or not a sense amplifier of a fuse circuit operates properly may be easily verified.

While the present invention has been described with respect to the specific embodiments, it will be apparent to those skilled in the art that various changes and modifications may be made without departing from the spirit and scope of the invention as defined in the following claims.

What is claimed is:

1. A fuse circuit, comprising:
   a data line;
   a plurality of fuse cells selectively programmed and electrically connected with the data line in response to respective selection signals;
   a dummy fuse cell electrically connected with the data line in response to a test signal; and
   a sense amplifier configured to sense a data of the data line.

2. The fuse circuit of claim 1, wherein the dummy fuse cell includes a resistor having the same resistance value as a programmed fuse cell of the fuse cells.

3. The fuse circuit of claim 1, wherein the dummy fuse sell includes a plurality of resistors and a plurality of switches and the resistance value of the dummy fuse cell is controlled by selectively turning on the switches.

4. The fuse circuit of claim 1, wherein each of the fuse cells comprises:
   a fuse configured to operate a capacitor or a resistor depending on whether the fuse is programmed or not; and
   a transistor configured to electrically connect the data line with the fuse in response to a corresponding selection signal.

5. The fuse circuit of claim 1, wherein the sense amplifier comprises:
   a resistor coupled between the data line and a source terminal; and
   a comparator configured to compare a voltage level of the data line with a reference voltage.

6. The fuse circuit of claim 1, wherein the dummy fuse cell comprises:
   a resistor coupled with a power supply voltage terminal; and
   a transistor configured to electrically connect the resistor with the data line in response to the test signal.

7. A semiconductor device, comprising:
   a data line;
   a plurality of fuse cells selectively programmed with a data and configured to transfer the programmed data to the data line in response to respective selection signals;
   a dummy fuse cell configured to include a resistor that is electrically connected with the data line in response to a test signal;
   a sense amplifier configured to sense the data transferred to the data line; and
   a plurality of registers configured to store the data sensed by the sense amplifier.

8. The fuse circuit of claim 7, wherein each of the fuse cells comprises:
   a fuse configured to operate a capacitor or a resistor depending on whether the fuse is programmed or not; and
   a transistor configured to electrically connect the fuse with the data line in response to a corresponding selection signal.

9. The fuse circuit of claim 7, wherein the dummy fuse cell includes:
   a resistor having the same resistance value as the programmed fuse; and
   a transistor configured to electrically connect the resistor with the data line in response to the test signal.

10. A method for testing a fuse circuit, comprising:
    enabling a test signal;
    coupling a resistor with a data line of the fuse circuit in response to the test signal to supply a pull-up voltage to the data line through the resistor; and
    comparing a voltage of the data line with a reference voltage to output a data.

11. The method of claim 10, where when coupling the resistor with the data line, current flows through the data line and drains to a ground through a pull-down resistor coupled between the data line and the ground.

12. The method of claim 10, further comprising:
    electrically disconnecting all fuse cells of the fuse circuit and the data line from each other, before the enabling of the test signal.

13. The method of claim 10, wherein the resistor has the same resistance value as a programmed fuse of the fuse circuit.

14. The method of claim 10, wherein if the data is a programmed data, a data sensing operation of the fuse circuit is determined to be normal, and if the data is different from the programmed data, a data sensing operation of the fuse circuit is determined to be abnormal.

15. The method of claim 10, further comprising:
    repeating the enabling of the test signal, the coupling the resistor with the data line, and the comparing the voltage of the data line with the reference voltage, after changing the resistance value of the resistor.

* * * * *